United States Patent
Kaller et al.

(10) Patent No.: US 8,248,578 B2
(45) Date of Patent: Aug. 21, 2012

(54) PROJECTION EXPOSURE METHOD AND PROJECTION EXPOSURE SYSTEM THEREFOR

(75) Inventors: Julian Kaller, Koenigsbronn (DE); Toralf Gruner, Aalen-Hofen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 562 days.

(21) Appl. No.: 12/410,640

(22) Filed: Mar. 25, 2009

(65) Prior Publication Data

US 2009/0237636 A1 Sep. 24, 2009

Related U.S. Application Data

(63) Continuation of application No. PCT/EP2007/008145, filed on Sep. 19, 2007.

(60) Provisional application No. 60/847,097, filed on Sep. 26, 2006.

(30) Foreign Application Priority Data

Sep. 26, 2006 (EP) .................................... 06020110

(51) Int. Cl.
 *G03B 27/52* (2006.01)
(52) U.S. Cl. ................. 355/30; 355/67; 355/77
(58) Field of Classification Search .......... 355/30, 355/67, 77
See application file for complete search history.

(56) References Cited

U.S. PATENT DOCUMENTS

| | | | | |
|---|---|---|---|---|
| 5,838,426 A * | 11/1998 | Shinonaga et al. | ............ | 355/52 |
| 6,252,648 B1 * | 6/2001 | Hase et al. | ............ | 355/53 |
| 6,341,006 B1 | 1/2002 | Murayama et al. | | |
| 6,493,066 B1 * | 12/2002 | Miwa | ............... | 355/67 |
| 6,707,529 B1 * | 3/2004 | Aoki et al. | ............... | 355/30 |
| 6,731,371 B1 * | 5/2004 | Shiraishi | ............... | 355/30 |

(Continued)

FOREIGN PATENT DOCUMENTS

DE 10218989 A1 11/2003

(Continued)

OTHER PUBLICATIONS

K. Yoshino et al.; "High Resolution Absorption Cross Section Measurements and Band Oscillator Strengths of the (1,0)-(12,0) Schumann-Runge Bands of $O_2$"; Planet Space Science (1983); pp. 339-353; vol. 31; No. 3.

*Primary Examiner* — Thomas R Artman
(74) *Attorney, Agent, or Firm* — Sughrue Mion, PLLC

(57) ABSTRACT

In a projection exposure method, primary radiation having a center wavelength $\lambda$ is generated and guided through an illumination system along an illumination path and through a projection system along a projection path. The center wavelength is varied within a wavelength variation range $\Delta\lambda$ having a lower limit $\lambda_{MIN} \leq \lambda$ and an upper limit $\lambda_{MAX} \geq \lambda$. A specific absorption coefficient $k(\lambda)$ of at least one gaseous absorbent species selected from the group consisting of oxygen ($O_2$), ozone ($O_3$) and water vapor ($H_2O$) present in at least one gas-filled space along at least one of the illumination path and the projection path varies between a minimum absorption coefficient $k_{MIN}$ and a maximum absorption coefficient $k_{MAX}$ within the wavelength variation range such that an absorption ratio ($k_{MAX}/k_{MIN}$) exceeds 10. A concentration of the absorbent species within the gas-filled space is controlled such that an overall absorption variation effected by the absorbent species for all rays running along differing ray paths towards the image field is maintained below a predetermined absorption variation threshold value.

30 Claims, 3 Drawing Sheets

U.S. PATENT DOCUMENTS

| | | |
|---|---|---|
| 6,891,596 B2 | 5/2005 | Rostalski et al. |
| 7,123,347 B2 * | 10/2006 | Suzuki .......................... 355/67 |
| 7,233,386 B2 * | 6/2007 | Reisinger et al. ............... 355/55 |
| 2002/0085185 A1 * | 7/2002 | Helmus et al. .................. 355/30 |
| 2003/0038929 A1 * | 2/2003 | Tokuda et al. .................. 355/30 |
| 2003/0210715 A1 * | 11/2003 | Lokai et al. ..................... 372/20 |
| 2004/0105085 A1 * | 6/2004 | Suzuki ........................... 355/69 |
| 2004/0160583 A1 * | 8/2004 | Hubertus Mulkens et al. .. 355/30 |
| 2005/0190435 A1 | 9/2005 | Shafer et al. |
| 2006/0068301 A1 | 3/2006 | Hirukawa |
| 2006/0245043 A1 | 11/2006 | Wehrhan et al. |
| 2007/0258072 A1 * | 11/2007 | Nagasaka et al. ............... 355/53 |
| 2008/0002265 A1 | 1/2008 | Epple |
| 2008/0213703 A1 | 9/2008 | Shafer et al. |

FOREIGN PATENT DOCUMENTS

| | | |
|---|---|---|
| EP | 0742492 A1 | 5/1996 |
| JP | 8-279458 A | 10/1996 |
| JP | 11-243050 A | 9/1999 |
| JP | 2000-133583 A | 5/2000 |
| JP | 2002-134384 A | 5/2002 |
| JP | 2005-266417 A | 9/2005 |
| JP | 2006-251805 A | 9/2006 |
| WO | 2005098506 A1 | 10/2005 |

* cited by examiner

PROJECTION EXPOSURE METHOD AND PROJECTION EXPOSURE SYSTEM THEREFOR

CROSS-REFERENCE TO RELATED APPLICATIONS

This application is a Continuation of International Application PCT/EP2007/008145, with an international filing date of Sep. 19, 2007, which was published under PCT Article 21(2) in English, and the complete disclosure of which is incorporated into this application by reference. This application claims the benefit under 35 U.S.C. 119(e)(1) of U.S. Provisional Application No. 60/847,097, filed Sep. 26, 2006. The disclosure of U.S. Provisional Application No. 60/877,743 is also hereby incorporated by reference into the present application. This application further claims priority under 35 U.S.C. 119(a) to European Patent Application No. 06 020 110.0 filed on Sep. 26, 2006. The entire contents of this application are also hereby incorporated by reference into the present application.

BACKGROUND OF THE INVENTION

1. Field of the Invention

The invention relates to a projection exposure method for exposing a radiation-sensitive substrate, arranged in the region of an image surface of a projection objective, with at least one image of a pattern of a mask arranged in the region of an object surface of the projection objective, and to a projection exposure system suitable for carrying out the method.

2. Description of the Related Art

Microlithographic projection exposure methods are currently used for fabricating integrated semiconductor devices and other finely structured components. Use is made of masks (reticles) that bear the pattern of a structure to be imaged, for example a line pattern of a layer of a semi-conductor component. A mask is positioned in a projection exposure system between an illumination system and projection objective in the region of the object surface of the projection objective, and illuminated with the aid of an illumination radiation provided by the illumination system on the mask. The radiation varied by the mask and the pattern runs as projection radiation through the projection objective, which images the pattern of the mask onto the substrate to be exposed, which normally bears a radiation-sensitive layer (photoresist).

Improving the spatial resolution of the projected images of masks having increasingly fine patterns is possible by both increasing the image-side numerical aperture (NA) of the projection objective and employing radiation having short wavelength. Currently, ultraviolet radiation having wavelength less than about 260 nm is frequently used. Many projection exposure systems using either refractive or catadioptric projection objectives use primary radiation provided by ArF excimer lasers having a center wavelength $\lambda \sim 193$ nm.

The optical performance of projection systems including refractive optical elements, such as lenses, is predominantly influenced by the refractive index difference occurring at optical interfaces, such as a lens surface adjacent to a gas filled space. Other characteristic design elements of an optical system, such as radia of optical surfaces, distances between optical surfaces, aspherical shape of optical surfaces etc. are optimized for a specific set of design parameters. Each variation of refractive index differences leads to additional imaging aberrations.

If one optical material adjacent to an optical surface is a gas, then pressure changes may lead to significant variations in the refractive index differences at optical surfaces since the density of the gas and, along therewith, the refractive index of the gas changes with gas pressure. Likewise, temperature variations will influence the refractive index differences. While pressure changes predominantly affect the gaseous material in an optical train, temperature changes normally affect gases as well as solid transparent materials, such as glass or crystalline fluorides, or the optical properties of optical liquids, such as immersion liquids optionally used in an optical train.

The refractive index difference at optical interfaces is also influenced by the wavelength of the radiation used. The optical dispersion $dn/d\lambda$ responsible for this effect is usually larger in solid materials and in liquids than in gaseous materials. For example, the dispersion $dn/d\lambda$ near $\lambda=193.368$ nm is about $-1.577 \times 10^{-6}$ pm$^{-1}$ for fused silica, about $-0.989 \times 10^{-6}$ pm$^{-1}$ for crystalline calcium fluoride and $-2.139 \times 10^{-6}$ pm$^{-1}$ for water (sometimes used as immersion liquid). Due to dispersion, slight changes of the center wavelength of radiation causes discernible refractive index variations within an optical system.

The U.S. Pat. No. 5,838,426 discloses a projection exposure system and a method where the wavelength of illumination radiation provided by a KrF excimer laser emitting a center wavelength $\lambda=248.4$ nm is changed in accordance with pressure changes occurring around the projection exposure system.

SUMMARY OF THE INVENTION

It is one object of the invention to provide a projection exposure method and system having an optical performance which can be made largely independent from pressure changes occurring around the projection exposure system. It is another object of the invention to provide a projection exposure method and system which are highly variable with respect to imaging aberration correction and compensation of imaging aberrations. It is another object of the invention to provide a projection exposure method and system utilizing primary radiation having a center wavelength of about 193 nm having an optical performance largely independent of atmospheric changes occurring around the projection exposure apparatus.

To address these and other objects, the invention, according to one formulation, provides a projection exposure method comprising:

generating primary radiation having a center wavelength $\lambda$;

guiding the primary radiation through an illumination system along an illumination path to generate illumination radiation incident in an illumination field on a mask bearing a pattern;

projecting an image of the pattern onto an image field on a radiation-sensitive substrate through a projection objective with projection radiation along a projection path;

varying the center wavelength within a wavelength variation range $\Delta\lambda$ having a lower limit $\lambda_{MIN} \leq \lambda$ and an upper limit $\lambda_{MAX} \geq \lambda$;

wherein within the wavelength variation range a specific absorption coefficient $k(\lambda)$ of at least one gaseous absorbent species selected from the group consisting of oxygen ($O_2$), ozone ($O_3$) and water vapor ($H_2O$) present in at least one gas-filled space along at least one of the illumination path and the projection path varies between a minimum absorption coefficient $k_{MIN}$ and a maximum absorption coefficient $k_{MAX}$ such that an absorption ratio ($k_{MAX}/k_{MIN}$) exceeds 10; and controlling a concentration of the absorbent species within the gas-filled space such that an overall absorption variation effected by the absorbent species for all rays running along differing ray paths towards the image field is maintained below a predetermined absorption variation threshold value.

The overall absorption variation should be substantially smaller tham 0.5% or 0.4%. The absorption variation threshold value in some embodiments is smaller than 0.3% or smaller than 0.2%. Preferable the absorption variation threshold value is 0.1% or less. If this condition is fulfilled, absorption does normally not critically influence field uniformity.

As explained in the outset of the application, atmospheric pressure variations influence the optical performance of projection exposure systems and should therefore be accounted for. One approach is to tune (or vary) the center wavelength $\lambda$ of the primary radiation such that the pressure induced changes of refractive index differences at the optical interfaces may at least partly be compensated by the wavelength dispersion in the optical media. However, dispersion is not the only aspect to be considered. The absorption of the media in gas-filled spaces along the optical train is also a function of pressure, temperature and wavelength. It is therefore useful to consider the absorption within the gas-filled spaces as well in order to achieve a reliable compensation strategy and optical performance in differing environments.

In many projection exposure systems presently used a space between the illumination system and the mask to be illuminated as well as a space between the mask and the projection objective is filled with air or another gas containing a comparable amount of oxygen ($O_2$). Also, a space between the exit surface of the projection objective and the substrate to be exposed is frequently filled with a gas containing oxygen, such as air, if no immersion liquid is used in that space. Other gaseous molecules containing oxygen atoms, such as ozone ($O_3$) and/or water vapor ($H_2O$), may also be present in certain amounts.

Oxygen exhibits strong absorption for ultraviolet radiation at specific wavelength in the wavelength region provided by a ArF excimer laser around 193.4 nm (see e.g. K. Yoshino, D. E. Freeman, et al.: "High Resolution Absorption Cross Section Measurements and Band Oscillator Strengths of the (1,0)-(12,0) Schumann-Runge Bands of $O_2$, Planet Space Sci. 31 (1983), No. 3, 339-353)

The absorption behaviour reflected by the Schumann-Runge bands has restricted prior systems having center wavelength of about 193 nm to utilize only center wavelength $\lambda$ selected from regions of low absorption between the absorption bands, for example selected from an interval between 193.33 nm to 193.45 nm. The corresponding wavelength variation range $\Delta\lambda \approx 0.12$ nm has been found to be sufficient to account for many applications where a variation of the center wavelength is desirable. For example, projection exposure systems usually should be adaptable for different altitudes to keep them operable with sufficient performance at sea level as well as at high altitudes such as 2,000 m above sea level or above. Also, variations according to whether induced pressure changes may be compensated in most cases. In this utilized wavelength variation range the absolute value of the specific absorption caused by oxygen (represented for example by the value of the absorption coefficient k or the absorption cross section $\sigma$) does not vary by more than a factor of 2 or 3. However, if a concentration of the absorbent species, such as oxygen, within the gas-filled spaces of the projection exposure system is controlled such that an overall absorption variation effected by the absorbent species for all rays running along differing ray paths towards the image field is maintained below a predetermined absorption variation threshold value, then the former limits of the wavelength variation range do no longer limit the potential widths of the wavelength variation range $\Delta\lambda$. For example, the smallest utilized wavelength, $\lambda_{MIN}$, may be adjusted to be below 193.30 nm. The wavelength variation range may include the region of a local absorption maximum of an absorption band at about 193.29 nm and may be smaller than this value. Alternatively, or in addition, the upper value, $\lambda_{MAX}$ of the wavelength variation range may be extended up to the other limiting local absorption maximum at about 193.49 nm or beyond, if desired.

In some embodiments, the condition $\Delta\lambda \geq 0.15$ nm is fulfilled for an absolute value $\Delta\lambda = \alpha_{MAX} - \lambda_{MIN}$ of the wavelength variation range. This allows higher degrees of freedom with respect to compensation of pressure and temperature dependent performance variations. Also, larger differences of the absolute refractive index of utilized solid transparent optical material may be compensated for, for example differences of up to $5 \times 10^{-5}$. This increased flexibility allows to decrease the expenditure on expensive measurements and allows higher flexibility with respect to utilizing different types of optical materials. For example, fused silica material and/or crystalline fluoride materials from different manufacturers which typically differ slightly with respect to their optical properties, can be tolerated within the optical system. Higher flexibility with respect to utilizing materials allows to further optimize other parameters, such as lifetime and costs.

In some embodiments an oxygen concentration $C_{ox}$ is maintained at values $C_{ox} < 10\%$ and/or $C_{ox} < 1\%$ and/or $C_{ox} < 1\%$ in each gas-filled space having a maximum axial extension of more than 1 mm, preferably in each gas-filled space irrespective of axial dimensions.

Gas-filled spaces which are problematic are also those spaces where large differences in optical path lengths occur between different rays. Such critical gas-filled spaces may be characterized by a large variation of angles of incidence at adjacent optical surfaces. In these cases, absorption caused for different rays may differ significantly depending on the angle of incidence. Therefore, in general, gas-filled spaces close to or bordering at field surfaces of the optical system may be critical. Those spaces include spaces close to the object surface and spaces close to the image surface of a projection objective. If a projection objective has at least one intermediate image, spaces close to the intermediate image may be also be critical due to large variations of optical path lengths between different rays.

In some embodiments a gas-filled space adjacent to the mask is encapsulated to form an encapsulated space transparent to radiation interacting with the mask. This encapsulated space may be evacuated to such an extent that the oxygen concentration is below a critical value (e.g. <10% or <1% oxygen). It is also possible to purge the gas-filled space by introducing into the gas-filled space a purging gas effective to decrease the concentration of the absorbent species, such as oxygen, below a critical concentration. Although the purging may be effected without encapsulating the critical gas-filled space, the purging gas is preferably guided into the encapsulated space to remove the absorbent species as desired. In this case, purging gas can be used economically.

Different purging gases may be utilized alone or in combination with each other. For example, nitrogen ($N_2$) or carbon dioxide ($CO_2$) or helium (He) or argon (Ar) may be used for purging.

Where a purging gas is used within an encapsulated space it may be preferable to keep the purging gas at an overpressure relative to a gas pressure in an environment surrounding the encapsulated space, whereby absorbent species present in the environment can be prevented from entering the encapsulated space in any significant amount. The over-pressure may be in the range from 50 to 1,000 Pa, for example.

Similar measures can be applied in the region between the exit surface of the projection objective and the substrate, if desired. In immersion systems, this space between the exit surface of the projection objective and the entry surface of the substrate is filled with an immersion liquid having a refractive index substantially larger than 1 during operation of the projection exposure system, thereby removing gaseous absorbent species from the space.

If the center wavelength λ of the radiation is changed in order to adjust the imaging performance of the projection objective to differing environmental conditions, the path of rays along the illumination path in the illumination system is also changed. This may cause the optical performance of the illumination system to decrease. Specifically, a required degree of telecentricity may deteriorate. In some embodiments this effect is accounted for by adjusting a telecentricity of the illumination radiation in response to a variation of the center wavelength such that a telecentricity error below a predetermined illumination radiation telecentricity error threshold value is obtained. Suitable telecentricity manipulation devices may be actuated accordingly.

The projection exposure method may also include the step of adjusting a telecentricity of the projection radiation in response to the variation of the center wavelength such that a telecentricity error below a predetermined projection radiation telecentricity error threshold value is obtained.

The steps of adjusting the telecentricity of the projection exposure system may comprise at least one of: displacing an aperture stop of the projection objective relative to an optical axis of the projection objective; adjusting a position of the substrate relative to the projection objective; adjusting a position of the mask to be imaged relative to the projection objective; and adjusting a position of a first component of the illumination system generating the illumination radiation relative to a second component of the illumination system.

A complete elimination of gaseous absorbent species within the projection exposure system may not always be necessary as long as the remaining effects caused by absorption are tolerable for the specific application. One remaining effect is caused by a variation of the absorption due to the fact that differing rays within the projection exposure system run along differing optical paths depending on the respective ray angles included with the optical axes. Generally, the overall absorption suffered along a ray paths will be dependent on the absolute length of space filled with a gaseous absorbent species on the way towards the image field. I some cases it may be beneficial to adjust a spatial intensity distribution in an exit pupil of the projection objective in response to a variation of the center wavelength such that an intensity distribution variation error below a predetermined radiation intensity distribution error threshold value is obtained. To this end a suitable filter element having a spatial variation of transmission adapted to the spatial intensity distribution may be introduced into the region of the exit pupil of the projection objective (or a region optically conjugate therewith) to compensate the intensity variation. Alternatively, a filter element having an angular-selective transmission characteristics corresponding to the spatial transmission distribution may be introduced close to or at a field plane in a position Fourier-transformed with respect to the exit pupil. German patent application DE 102 18 989 A1 filed by the applicant discloses suitable filter elements and methods which can be adapted for this purpose. The disclosure of this application is incorporated herein by reference.

In some embodiments the spatial intensity distribution in the exit pupil of the projection objective is adjusted in response to a variation of the center wavelength such that an intensity distribution variation error below 1% is obtained. That error may be 0.8% or less, or 0.5% or less, for example. Preferably the intensity distribution variation error lies below 0.1%, e.g. at 0.08% or less or at 0.05% or less. Values in the order of about 0.01% may be acceptable in many cases.

Some embodiments are configured to allow measuring the concentration of the absorbent species in at least one gas-filled space to generate a concentration signal and controlling emission of the primary radiation in response to the concentration signal. In this case, the projection exposure system is able to react in a short time scale to changes in the environment, such as increase or decrease of ambient pressure, or in response to error conditions of the optical system. The system may be configured such that the controlling of emission includes shutting off the emission of primary radiation if the concentration signal in the monitored space or spaces indicates that the concentration of the absorbent species exceeds a predetermined concentration threshold value in the gas-filled space. A more stable process may be obtained by these additional security details.

The individual features may be implemented either alone or in combination as embodiments of the invention, or may be implemented in other fields of application. Further, they may represent advantageous embodiments that are patentable in their own right, for which protection is claimed in the application as filed or for which protection will be claimed during pendency of the application.

DETAILED DESCRIPTION OF THE PREFERRED EMBODIMENTS

Figure 1:
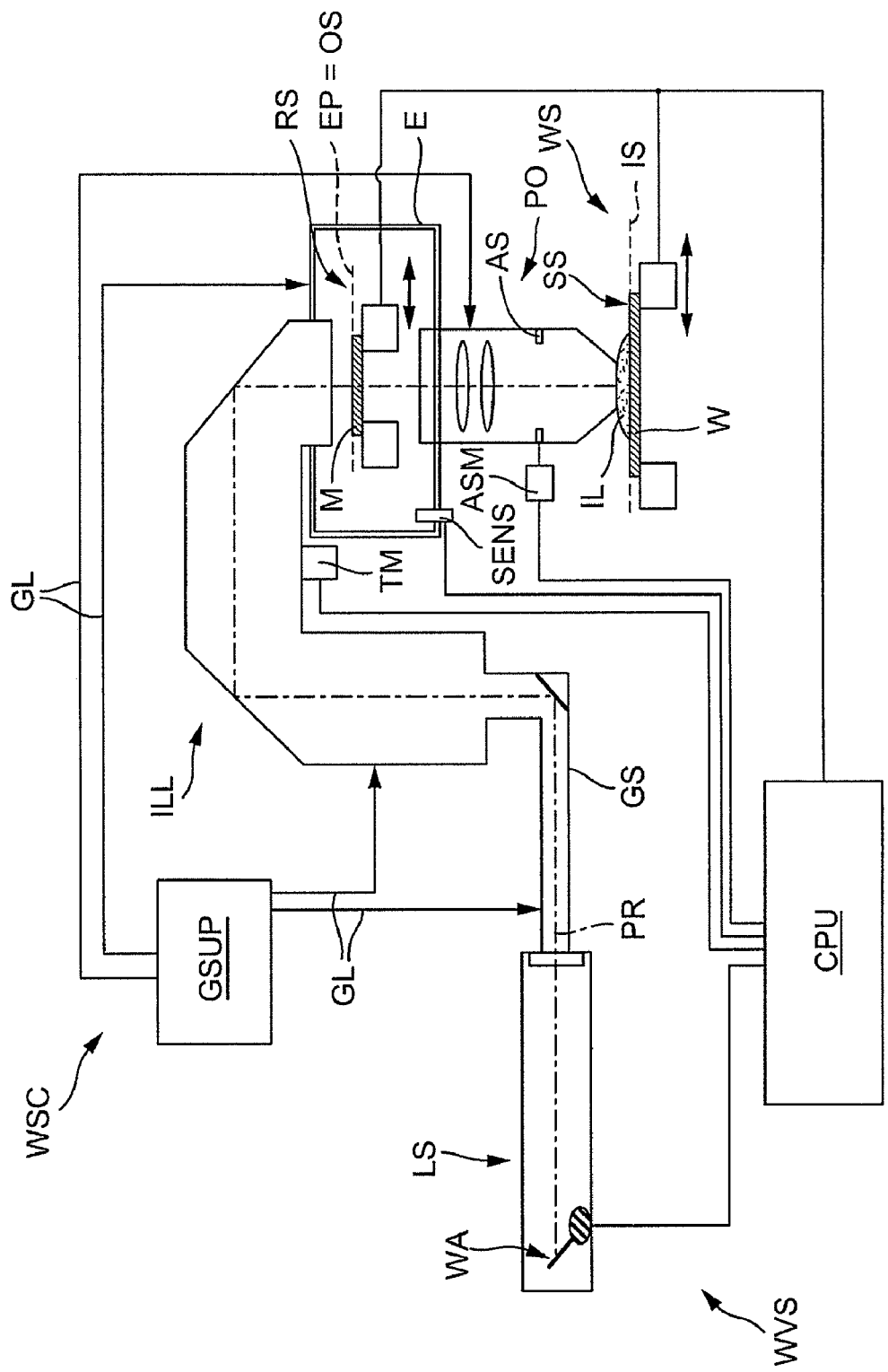
FIG. 1 shows a schematic drawings of an embodiment of a projection exposure system configured for performing a projection exposure method according to an embodiment of the invention.

FIG. 1 shows a schematic drawing of an embodiment of a microlithographic projection exposure system configured as a wafer scanner WSC utilized for producing highly integrated semiconductor components by means of immersion lithography. The system includes a primary light source LS formed by a ArF excimer laser for generating primary radiation PR having a center wavelength λ~=193.4 nm. The emitted beam of primary radiation PR is guided by a gas tight guiding system GS towards the entry of an illumination system ILL configured to transform the primary radiation into illumination radiation incident on a mask M bearing a pattern to be imaged onto light sensitive substrate W. The illumination system ILL includes a large number of optical components and optical units allowing to select various illumination modes such that the illumination mode can be switched, for example, between conventional illumination with a desired degree of coherence, annular field illumination and dipole or quadrupole illumination. The illumination system produces a large, sharply limited illumination field with largely homogenous illumination which is matched to the telecentricity requirements of a projection objective PO arranged optically downstream of the mask. The optical components of the illumination system are encapsulated by suitable encapsulating structure in an essentially gas-tight manner in gas communication with the guide system GS.

Figure 3:
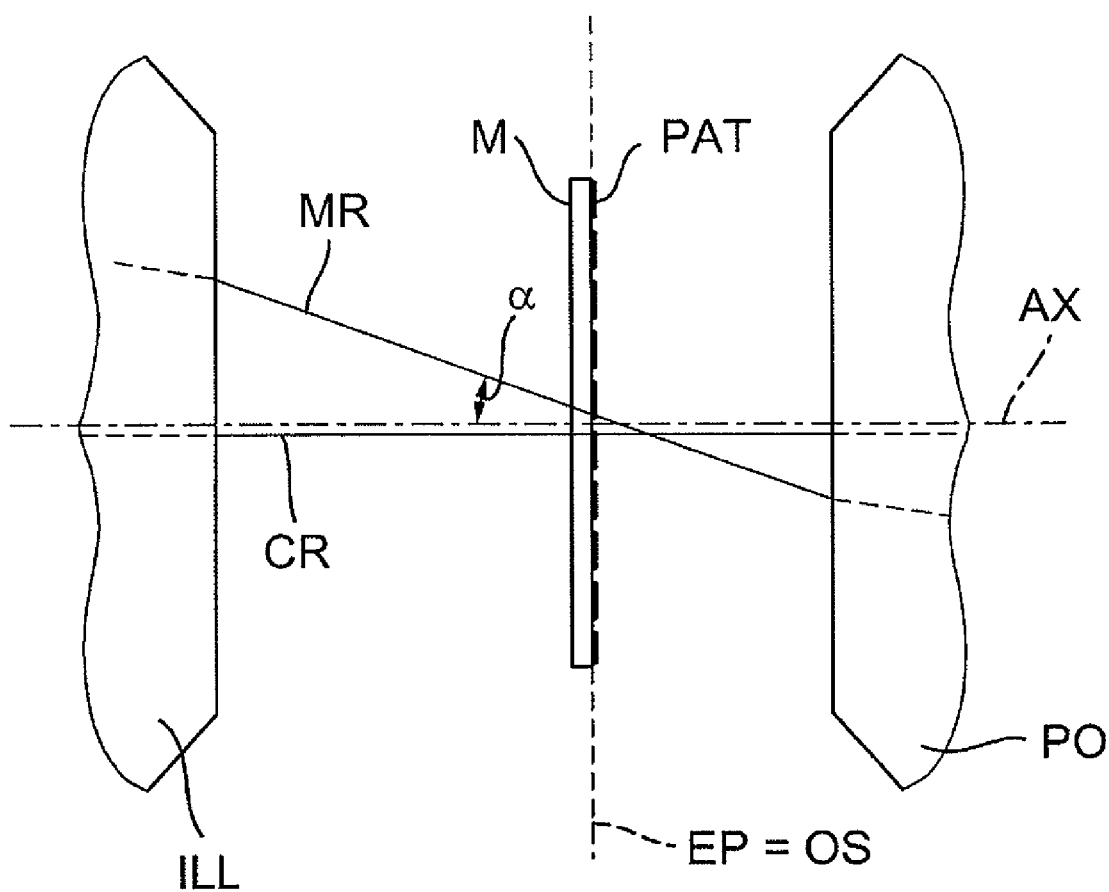
FIG. 3 shows a schematic, enlarged representation of geometric conditions in the space between the illumination system and the projection objective where the mask is situated.

A device RS (recticle stage) for holding and manipulating the mask M is arranged generally in a region between the exit side of the illumination system and the entry side of the projection objective in such a way that the pattern PAT provided on the mask M is located in the object surface OS of the projection objective, which coincides with the exit plane EP of the illumination system (FIG. 3). The device RS includes a scanning drive allowing for the mask to be moved in a scanning direction perpendicular to the optical axes of illumination system and projection objective parallel to the object surface OS.

The plane OS, which is also referred to as mask plane (or reticle plane) is followed by the projection objective PO which is configured to image an image of the mask at a reduced scale, e.g. 4:1, onto a radiation-sensitive substrate in the form of a semiconductor wafer W coated with a photoresist layer. Reduction scales other than 4:1, for example 5:1, 10:1 or more, are likewise possible. The projection objective PO may be purely refractive, such as disclosed for example in applicant's U.S. Pat. No. 6,891,596 B2, or may be a catadioptric optical system including one or more concave mirrors, for example, as disclosed in applicant's applications WO 2005/098506 or US 2005/0190435 A1. The disclosures of these applications are incorporated into this application by reference.

The wafer W coated with a photoresist layer, used as a light-sensitive substrate, is arranged such that the planar substrate surface SS and the photoresist layer coated thereon essentially coincide with the planar image surface IS of the projection objective PO. The wafer is held by the device WS (wafer stage) comprising a scanner drive in order to move the wafer synchronously with the mask M and parallel to the mask in opposite directions for scanning operation. The wafer stage also includes manipulators in order to move the wafer both in z direction parallel to the optical axis of the projection objective and in the x and y directions at right angles to this axis and to each other. A tilting device is integrated and has at least one tilting axis running at right angles to the optical axis of the projection objective. Additional degrees of freedom for manipulation may be provided.

The device WS provided for holding the wafer W is designed for allowing immersion lithography. It may include a flat liquid-tight holding structure which is open at the top side facing the projection objective and dimensioned to receive an immersion liquid IL such that when the immersion liquid is introduced into the holding structure the immersion liquid completely covers the substrate surface SS at least in the area to be exposed and that the exit surface of the projection objective PO can be immersed in the immersion liquid such that the entire working distance between the exit surface of the projection objective and the substrate surface is filled with the immersion liquid. The entire exposure system is controlled by a central processing unit CPU.

The projection exposure system is equipped with a wavelength variation system WVS configured for varying the center wavelength $\lambda$ of the primary radiation PR emitted by the laser light source LS within a maximum wavelength variation range $\Delta\lambda \geq 0.15$ nm, for example between about 193.27 nm and 193.46 nm. The light source comprises a laser resonator and a wavelength adjusting element WA cooperating with the laser resonator. The wavelength adjusting element may comprise, for example, a grating by which the band width of the radiation exiting the laser can be narrowed. By changing the inclination angle of the grating relative to the resonator the emitted center wavelength $\lambda$ can be changed within the range of the inherent wavelength band of the laser resonator. The tiltable grating is connected to a drive (not shown), which is controlled by a wavelength variation control unit integrated into the central processing unit CPU. Other means for variably adjusting the emitted wavelength of the laser may also be used.

An encapsulating structure E is provided to allow the space between the exit end of the illumination system and the entry end of the projection objective to be encapsulated in an essentially gas-tight manner. To this end, the encapsulating structure takes the form of a container having an illumination side opening adapted to sealingly engage the outside of the exit side end of the illumination system and another opening on the opposite side thereof to sealingly receive the entry side end of the projection objective. The encapsulating structure E is dimensioned such that all movable mechanical parts of the recticle stage RS can be included therein so that only power lines etc. have to be guided through the wall of the encapsulating structure. A gas sensor SENS provided to emit electrical sensor signals in response to detected amounts of oxygen in the interior of the encapsulating structure is mounted within the encapsulating structure or in the wall thereof and connected electrically to the central processing unit CPU. A selected portion of the central processing unit is configured to generate a shutoff signal to the light source LS in response to a sensor signal provided by the gas sensor SENS indicating that the oxygen partial pressure within the encapsulating structure E exceeds a critical threshold value.

The projection objective PO has a variable aperture stop AS arranged near or at a pupil surface of the projection objective. An aperture stop manipulator ASM is provided to adjust the effective diameter of the aperture stop (determining the utilized NA value) and allows also to shift the position of the aperture stop relative to the optical axis by lateral shifting movements and/or tilting, whereby the telecentricity conditions at the image side can be adjusted. The aperture stop manipulator ASM is electrically connected to the central processing unit. A telecentricity manipulator TM connected to the illumination system ILL is also connected to the central processing unit and allows to adjust the telecentricity of the illumination radiation incident on the mask M by shifting and/or tilting selected optical elements of the illumination system relative to one another.

A gas supply system GSUP is connected to the inside of the guide system GS, the illumination system ILL, the encapsulating structure E and the projection objective PO through gas lines GL. In the embodiment, the gas supply system is configured to purge all mentioned spaces within the optical system continuously with an essentially oxygen-free gas, such as nitrogen or argon. More than one gas supply system may be provided in other embodiments to allow feeding different purging gases to different parts of the optical paths traversed by the radiation.

Figure 2:
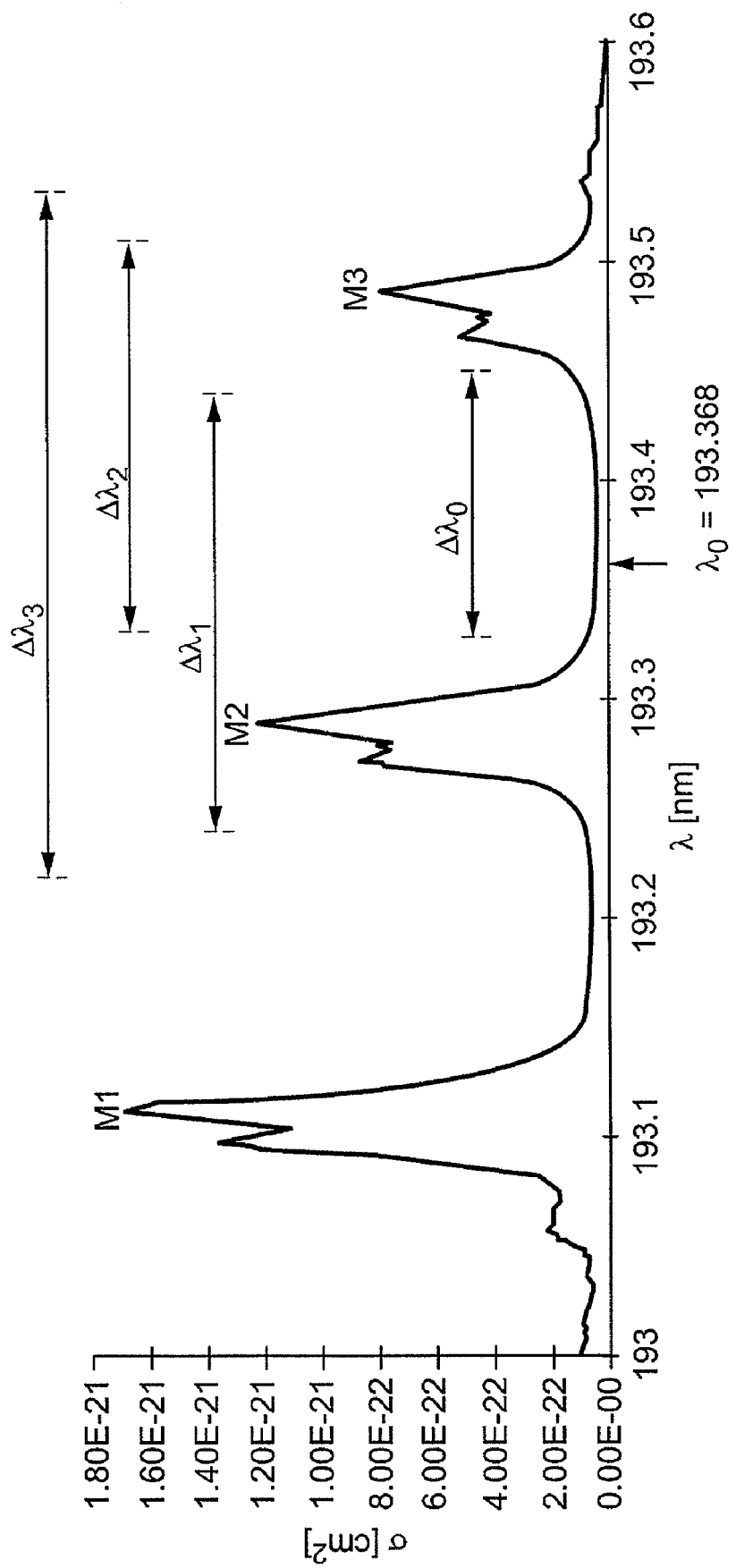
FIG. 2 shows a diagram resulting from measurements of the absorption cross section in the Schumann-Runge bands according to literature values and different wavelength variation ranges adapted to the absorption bands.

Some problems created by the presence of oxygen in the optical path of projection exposure systems working at about 193 nm wavelength will now be explained in connection with FIGS. 2 and 3. FIG. 2 shows experimental data for the $O_2$ absorption cross sections $\sigma$ [cm$^2$] as a function of the vacuum wavelength $\lambda$ [nm] between 193.0 and 193.6 at 300K (from: K. Yoshino, D. E. Freeman, et al.: "High Resolution Absorption Cross Section Measurements and Band Oscillator Strengths of the (1,0)-(12,0) Schumann-Runge Bands of $O_2$, Planet Space Sci. 31 (1983), No. 3, 339-353). In this wavelength interval, three local maxima M1, M2 and M3 for the $O_2$ absorption cross section (so-called Schumann-Runge bands) exist. It is contemplated that the best laser efficiency of a ArF laser (influenced by the global maximum of laser power and relatively low values of $O_2$ absorption) is obtained for a wavelength $\lambda_0$=193.368 nm (corresponding to $\sigma$=3.01×10$^{-23}$ cm$^2$ or k=8.1×10$^{-4}$ cm$^{-4}$ atm$^{-1}$). It is evident from FIG. 2 that the cross section value is significantly larger at the nearby local absorption maxima M2 and M3 to the lower $\lambda$ and higher $\lambda$ side. For example, the absorption cross section is about 50 times as large at the local absorption maximum M2 to the lower A side at about 193.29 nm (Here k~3.2×10$^{-2}$ cm$^{-4}$ atm$^{-1}$).

Now consider the absorption ABS caused by oxygen, which can be derived from the coefficient k of absorption according to:

$$ABS=1-(I/I_0)=e^{-kL},$$

where ($I/I_0$) is the transmission T and L represents the geometrical length of the optical path where absorption occurs. The absorption coefficient k can be calculated using the cross section a of the absorption assuming ideal gas conditions using the ideal gas equation:

$$k=\sigma n,$$

where n=$\mu$n*P/RT, where n=density of the gaseous species [cm$^{-3}$], n*=fraction of the gaseous species in air, P=pressure [bar], T=ambient temperature [° C.]+273.16, R=universal gas constant and $\mu$=a conversion constant for the dimensions. Therefore, the conditions shown in FIG. 2 for the absorption cross section $\sigma(\lambda)$ translate directly to the conditions for the (wavelength dependent) absorption coefficient k($\lambda$) where temperature and pressure are constant.

Consider now a conventional projection exposure system were at least some of the gas-filled spaces traversed by the radiation are filled with air which normally contains about 20% oxygen. In order to avoid absorption induced performance losses it is desirable to select a center wavelength $\lambda$ of a system such that absorption by oxygen is largely avoided. Therefore, center wavelengths $\lambda$ close to $\lambda_0$ may be used. If a variation of the center wavelength is desired, for example to compensate for aberrations caused by pressure variations, the wavelength variation range $\Delta\lambda$ should still include only wavelengths where the absorption level is relatively low, e.g. values within the broad local minimum around about 193.4 nm. A possible wavelength variation range $\Delta\lambda_0$ extending approximately between $\lambda_{MIN}$=193.33 nm and $\lambda_{MAX}$=193.45 nm is indicated. Within this range, the value of the absorption caused by oxygen does not vary by more than a factor of three. Whereas the absolute range $\Delta\lambda$=0.12 nm possible in this region may be sufficient for many applications to account for aberrations variations due to ambient pressure variations etc., larger absolute values for $\Delta\lambda$ are desirable.

In the exposure system of FIG. 1 the entire optical path transversed by the radiation is kept essentially free of oxygen by introducing an essentially oxygen-free gas into all gas-filled spaces between the light source LS and the substrate W to be exposed. Although a reduction of the oxygen concentration from about 20% to about 10% may be sufficient in some case, the actual reduction obtained is such that there is less than 1% oxygen in the gas-filled spaces, whereby the absorbing effect of oxygen is significantly reduced. Under these conditions the center wavelength $\lambda$, may be shifted to values corresponding to relatively high values of specific absorption (expressed by absorption coefficient k($\lambda$) or absorption cross section $\sigma(\lambda)$, respectively). Three exemplary available wavelength variation ranges $\Delta\lambda_1$, $\Delta\lambda_2$ and $\Delta\lambda_3$ are schematically indicated in FIG. 2. In the case of $\Delta\lambda_1$ the lowest value $\lambda_{MIN}$ of the wavelength variation range LS below the lower wavelength absorption band M2 at about 193.23 nm and includes the local absorption maximum at 193.29 nm. Since the maximum wavelength value $\lambda_{MAX}$ of $\lambda\Delta_1$ is 193.45 nm, an absolute value $\Delta\lambda_1$=0.19 nm is obtained. As indicated by the second wavelength variation range $\Delta\lambda_2$ it is also possible to extend the maximum wavelength value $\lambda_{MAX}$ to values beyond the upper absorption maximum M3 such that, for example $\lambda_{MAX}$=193.52. If desired, a wavelength variation range $\Delta\lambda_3$ may include both the local absorption maxima M2, M3 on either side of $\lambda_0$. Generally, it may be desirable to have the wavelength variation range as wide as possible, since a wide wavelength variation range allows to tolerate larger values of refractive index variations, e.g. due to pressure variation or variations within the optical material. A wavelength variation range between 193.2 nm and 193.5 nm ($\Delta\lambda_3$=0.3 nm) may be useful. Wider wavelength variation ranges, such as between 193.0 nm and 193.6 nm ($\Delta\lambda$=0.6 nm) may be obtained.

Different rays running at differing ray angles with respect to the optical axis through the exposure system will usually suffer different absolute absorption ABS on the way to the image surface, whereby imaging characteristics, such as the telecentricity may be negatively affected. Some estimates are presented now in connection with FIG. 3, which shows the geometrical space between the exit end of the illumination system ILL and the entry side of the projection objective PO where the mask M bearing the pattern PAT disposed in the object surface OS of the projection objective PO is arranged. The radiation travelling from the illumination system to the projection objective is represented by a central ray CR running essentially along the optical axis AX of the projection objective and a marginal ray MR running towards the edge of the aperture stop AS of the projection objective. The angle $\alpha$ included between the marginal ray and the optical axis is determined by the image-side numerical aperture of the projection objective and the reduction ratio thereof. In an exemplary case of an immersion system having NA=1.35 and a 4:1 reduction ratio the object-side numerical aperture (corresponding to sin $\alpha$) is 0.3375 when the space around the mask is filled with air (n=1). Under these geometrical conditions the difference in geometrical path length between the central ray and the marginal ray is about 6% within this gas-filled space. It is evident, that the difference is smaller for smaller NA values, for example the difference is in the order of 3% for NA=0.93 with the same reduction ratio. Considering further geometrical effects caused by curved lens surfaces (increasing the traverse space of marginal rays as compared to central rays) a geometrical path difference between central ray and marginal ray in typical high-aperture projection objectives of the type considered here may be in the order of 10%

Now consider typical dimensions of the space between illumination system and projection objective, which typically is in the order of 10 millimeters or more, such as at least 20 mm, at least 40 mm, at least 60 mm, at least 80 mm or at least 100 mm. A representative value for the absorption in this region may be ABS=0.15% if the center wavelength $\lambda$ corresponds to local minimum value in the absorption curve (see FIG. 2).

Considering the geometrical path difference mentioned above a typical variation of absorption between the central ray and the marginal ray should be in the order of 0.015% when minimum absorption (low k or σ value) is considered. If, however, the center wavelength λ is selected such that the corresponding absorption in gas-filled spaces corresponds to a local maximum, such as M2 in FIG. 2, the effect of absorption may be 50 times higher, leading to a difference in absorption between the central ray and the marginal ray in the order of 0.75%.

Another numerical example is presented for a projection objective having image-side numerical aperture NA=1.35 and a 4:1 reduction ratio, where a space between the exit surface of the illumination system and the entry surface of the projection objective is 90 mm. In that case, a geometrical path difference PD between the longest ray running at maximum NA and the shortest ray running parallel to the optical axis is $PT=90 \text{ mm} \cdot (1/\sqrt{1-(1.35/4)^2})-1)=5.4$ mm. According to this general geometric relationship this corresponds to a pupil apotization which is largely independent of the field and which has an amplitude corresponding to the absorption of the gas in the respective gas-filled space. Typical variations of the intensity profile in the exit pupil of the projection objective are in the order of 0.01% under these conditions, which may be considered acceptable in many cases.

Differences significantly larger than that, for example variations larger by a factor 10 or by a factor 100 (i.e. larger than 0.1% or larger than 1%) are normally not negligible since a corresponding intensity distribution of radiation in the exit pupil surface of the projection objective (where the aperture stop is situated) will become non-uniform with lower intensity in regions travelled by rays with a relatively long geometrical ray path through gas-filled spaces as compared to rays passing through the system close to the optical axis. An absorption-induced intensity variation in the exit pupil typically transforms into an absorption-induced telecentricity error at the exit of the projection objective, since the telecentricity error may be considered as an image-side tilt angle of a central ray (or chief ray) which ideally travels parallel to the optical axis at the image-surface of an image-side telecentric optical system. In other words: absorption influencing different rays traversing the optical system differently will generally shift the energy centroid of the radiation exiting the projection objective, leading to a telecentricity error.

The absorption-induced telecentricity errors are largely avoided in an embodiment of the invention by essentially removing the strongly absorbing oxygen from any gas-filled space in the system. As explained above this can be achieved by purging the entire path used by the radiation with nitrogen or another gas with no or low absorption in the desired wavelength region. Depending on the specification regarding telecentricity errors small amounts of absorbing species may be allowable in some spaces, particularly in spaces with small dimensions, such that no significant absorption may occur in this regions. For example, it may be sufficient to purge only those spaces which extend axially by more than a given value, such as 1 mm or 2 mm. Since, in the embodiment the space around the mask is the largest open space transversed by the radiation, it is particularly efficient to remove oxygen (and other absorbent species, such as water and ozone) from this area. In any case, the negative effect of absorption can be largely eliminated to such an extent that any residual absorption is acceptable depending on the specification.

By removing absorbent species, particularly oxygen, from the beam path the exposure system in FIG. 1 allows large variations of the center wavelength λ effected by the wavelength variation system WVS. If the center wavelength λ is changed, for example in order to adjust the imaging performance of the projection objective to changes of atmospheric pressure and/or temperature, the paths of rays within this system are also changed. This typically causes the optical system to deviate from the optical performance optimized for the initial design wavelength. Specifically, a required degree of telecentricity of the illumination system may deteriorate. In the embodiment this is compensated by adjusting the telecentricity of the illumination radiation in response to a variation of the center wavelength such that the telecentricity error does not exceed a selected telecentricity error threshold value. To this end, optical components of the illumination system may be shifted an/or tilted relative to each other by the telecentricity manipulation device TM in order to adjust telecentricity. Suitable devices and method for the purpose of adjusting the telecentricity of an illumination system are disclosed in U.S. application Ser. No. 60/634,993 filed Dec. 13, 2004 by the applicant, the disclosure of which is incorporated herein by reference.

Alternatively, or in addition, at least one grey filter may be used in a pupil surface to compensate for residual intensity inhomogeneties. The local (spatial) transmission profile of the grey filter should be variable and/or the grey filter should be associated with an exchanging device for optionally inserting or removing grey filters of different transmission profile into the optical path. In many embodiments, grey filters or similar devices may not be needed in embodiments of the invention.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

What is claimed is:

1. A projection exposure method comprising:
   generating primary radiation having a center wavelength λ;
   guiding the primary radiation through an illumination system along an illumination path to generate illumination radiation incident in an illumination field on a mask bearing a pattern;
   projecting an image of the pattern onto an image field on a radiation-sensitive substrate through a projection objective with projection radiation along a projection path;
   varying the center wavelength within a wavelength variation range Δλ having a lower limit $\lambda_{MIN} \leq \lambda$ and an upper limit $\lambda_{MAX} \geq \lambda$;
   wherein, within the wavelength variation range, a specific absorption coefficient k(λ) of at least one gaseous absorbent species, selected from the group consisting of oxygen ($O_2$), ozone ($O_3$) and water vapor ($H_2O$) and present in at least one gas-filled space along at least one of the illumination path and the projection path, varies between a minimum absorption coefficient $k_{MIN}$ and a maximum absorption coefficient $k_{MAX}$ such that an absorption ratio ($k_{MAX}/k_{MIN}$) exceeds 10; and
   controlling a concentration of the absorbent species within the gas-filled space such that an overall absorption variation effected by the absorbent species for all rays running along differing ray paths towards the image field is maintained below a predetermined absorption variation threshold value.

2. The method according to claim 1, wherein the absorption variation threshold value is 0.1% or less.

3. The method according to claim 1, wherein the condition $\Delta\lambda \geq 0.15$ nm is fulfilled for an absolute value $\Delta\lambda = \lambda_{MAX} - \lambda_{MIN}$ of the wavelength variation range.

4. The method according to claim 1, wherein at least one of the conditions $\lambda_{MIN}<193.30$ nm and $\lambda_{MAX}>193.50$ nm is fulfilled.

5. The method according to claim 1, wherein 193 nm$<\lambda_{MIN}<193.30$ nm and 193.50 nm$<\lambda_{MAX}<194$ nm.

6. The method according to claim 1, wherein the absorbent species is oxygen.

7. The method according to claim 1, wherein an oxygen concentration $c_{OX}$ is maintained at values $c_{OX}<10\%$ in a gas-filled space between an exit surface of the illumination system and an entry surface of the projection objective.

8. The method according to claim 1, further comprising:
adjusting a telecentricity of the illumination radiation in response to a variation of the center wavelength to obtain at least one of: a telecentricity error below a predetermined illumination radiation telecentricity error threshold value and a telecentricity error below a predetermined projection radiation telecentricity error threshold value.

9. The method according to claim 1, further comprising:
adjusting a spatial intensity distribution in an exit pupil of the projection objective in response to a variation of the center wavelength such that an intensity distribution variation error below a predetermined radiation intensity distribution error threshold value is obtained.

10. The method according to claim 1, further comprising:
measuring the concentration of the absorbent species in at least one gas-filled space to generate a concentration signal; and
controlling emission of the primary radiation in response to the concentration signal.

11. The method according to claim 1, further comprising:
encapsulating a gas-filled space adjacent to the mask to form an encapsulated gas-filled space transparent to radiation interacting with the mask; and
removing absorbent species from the encapsulated space such that the concentration of the absorbent species falls below a critical concentration.

12. The method according to claim 11, wherein the removing of the absorbent species comprises purging the gas-filled space by introducing into the gas-filled space a purging gas effective to decrease the concentration of the absorbent species below a critical concentration.

13. The method according to claim 12, wherein the purging gas is maintained within the encapsulated space at an overpressure relative to a gas pressure in an environment surrounding the encapsulated space.

14. The method according to claim 11, wherein the gas-filled space surrounds the mask and extends from the illumination system to the projection objective.

15. The method according to claim 1, further comprising:
filling a space between an exit surface of the projection objective and an entry surface of the substrate with an immersion liquid having a refractive index substantially larger than 1.

16. A projection exposure apparatus comprising:
a light source generating primary radiation having a center wavelength $\lambda$ between 193 nm and 194 nm;
an illumination system guiding the primary radiation along an illumination path to generate illumination radiation incident on a mask bearing a pattern;
a projection objective projecting an image of the pattern onto a radiation-sensitive substrate with projection radiation guided along a projection path;
a wavelength variation system varying the center wavelength within a wavelength variation range having a lower limit $\lambda_{MIN}\leq\lambda$ and an upper limit $\lambda_{MAX}\geq\lambda$,
wherein, within the wavelength variation range, a specific absorption coefficient $k(\lambda)$ of at least one gaseous absorbent species selected from the group consisting of oxygen ($O_2$), ozone ($O_3$) and water vapor ($H_2O$) present in at least one gas-filled space along at least one of the illumination path and the projection path varies between a minimum absorption coefficient $k_{MIN}$ and a maximum absorption coefficient $k_{MAX}$ such that an absorption ratio ($k_{MAX}/k_{MIN}$) exceeds 10; and
an absorption control system for controlling a concentration of the absorbent species within the gas-filled space such that an overall absorption variation effected by the absorbent species for all rays running along differing ray paths towards the image field is maintained below a predetermined absorption variation threshold value.

17. The projection exposure apparatus according to claim 16, wherein the absorption control system includes an encapsulating structure configured to encapsulate a gas-filled space adjacent to the mask to form an encapsulated gas-filled space transparent to radiation interacting with the mask; and
a system configured for removing absorbent species from the encapsulated space such that the concentration of the absorbent species falls below a critical concentration.

18. The projection exposure apparatus according to claim 17, wherein the system configured for removing absorbent species comprises a gas supply system configured to purge the gas-filled space by introducing into the gas-filled space a purging gas effective to decrease the concentration of the absorbent species below a critical concentration.

19. The projection exposure apparatus according to claim 17, wherein the gas-filled space surrounds the mask and extends from the illumination system to the projection objective.

20. The projection exposure apparatus according to claim 16, further comprising:
a structure configured to fill a space between an exit surface of the projection objective and an entry surface of the substrate with an immersion liquid having a refractive index substantially larger than 1.

21. The projection exposure apparatus according to claim 16, further comprising:
a telecentricity manipulator configured to adjust a telecentricity of the illumination radiation in response to a variation of the center wavelength to obtain at least one of a telecentricity error below a predetermined illumination radiation telecentricity error threshold value, and a telecentricity error below a predetermined projection radiation telecentricity error threshold value.

22. The projection exposure apparatus according to claim 16, further comprising:
a measuring system configured to measure the concentration of the absorbent species in at least one gas-filled space to generate a concentration signal; and
a control system configured to control emission of the primary radiation in response to the concentration signal.

23. A projection exposure apparatus comprising:
a light source generating primary radiation having a center wavelength $\lambda<200$ nm;
an illumination system guiding the primary radiation along an illumination path to generate illumination radiation incident on a mask bearing a pattern;
a projection objective projecting an image of the pattern onto a radiation-sensitive substrate in an image field with projection radiation guided along a projection path;
a wavelength variation system configured to vary the center wavelength within a wavelength variation range having a lower limit $\lambda_{MIN} \leq \lambda$ and an upper limit $\lambda_{MAX} \geq \lambda$, wherein the condition $\lambda\lambda \geq 0.15$ nm is fulfilled for an absolute value $\Delta\lambda = \lambda_{MAX} - \lambda_{MIN}$ of the wavelength variation range; and an absorption control system for controlling a concentration of at least one gaseous absorbent species selected from the group consisting of oxygen ($O_2$), ozone ($O_3$) and water vapor ($H_2O$) present in at least one gas-filled space along at least one of the illumination path and the projection path such that an overall absorption variation effected by the absorbent species for all rays running along differing ray paths towards the image field is maintained below a predetermined absorption variation threshold value.

24. The projection exposure apparatus according to claim 23, wherein at least one of: the wavelength variation range includes a wavelength range between 192.2 nm and 193.5 nm, the light source is an ArF excimer laser, and 193 nm $< \lambda_{MIN} <$ 193.30 nm and 193.50 nm $< \lambda_{MAX} <$ 194 nm.

25. The projection exposure apparatus according to claim 23, wherein the absorption control system includes an encapsulating structure configured to encapsulate a gas-filled space adjacent to the mask to form an encapsulated gas-filled space transparent to radiation interacting with the mask; and a system configured for removing absorbent species from the encapsulated space such that the concentration of the absorbent species falls below a critical concentration.

26. The projection exposure apparatus according to claim 25, wherein the system configured for removing absorbent species includes a gas supply system configured for purging the gas-filled space by introducing into the gas-filled space a purging gas effective to decrease the concentration of the absorbent species below a critical concentration.

27. The projection exposure apparatus according to claim 25, wherein the gas-filled space surrounds the mask and extends from the illumination system to the projection objective.

28. The projection exposure apparatus according to claim 23, further comprising:

a structure configured for filling a space between an exit surface of the projection objective and an entry surface of the substrate with an immersion liquid having a refractive index substantially larger than 1.

29. The projection exposure apparatus according to claim 23, further comprising:

a telecentricity manipulator configured to adjust a telecentricity of the illumination radiation in response to a variation of the center wavelength to obtain at least one of: a telecentricity error below a predetermined illumination radiation telecentricity error threshold value and a telecentricity error below a predetermined projection radiation telecentricity error threshold value.

30. The projection exposure apparatus according to claim 23, further comprising:

a measuring system configured to measure the concentration of the absorbent species in the at least one gas-filled space to generate a concentration signal; and a control system configured to control emission of the primary radiation in response to the concentration signal.

* * * * *

UNITED STATES PATENT AND TRADEMARK OFFICE
CERTIFICATE OF CORRECTION

PATENT NO.        : 8,248,578 B2
APPLICATION NO.   : 12/410640
DATED             : August 21, 2012
INVENTOR(S)       : Julian Kaller et al.

It is certified that error appears in the above-identified patent and that said Letters Patent is hereby corrected as shown below:

Column 1, Line 57: delete "$\lambda$~193" and insert -- $\lambda \approx 193$ --
Column 3, Line 10: delete "tham" and insert -- than --
Column 3, Line 46: after "353)" insert -- . --
Column 4, Line 17: delete "$\Delta\lambda = \alpha_{MAX} - \lambda_{MIN}$" and insert -- $\Delta\lambda = \lambda_{MAX} - \lambda_{MIN}$ --
Column 4, Line 49: after "may" delete "be"
Column 6, Line 59: delete "$\lambda$~=193.4" and insert -- $\lambda \approx 193.4$ --
Column 7, Line 11: delete "(recticle" and insert -- (reticle --
Column 8, Line 25: delete "recticle" and insert -- reticle --
Column 9, Line 16: delete "$k$~$3.2 \times 10^{-2}$" and insert -- $k \approx 3.2 \times 10^{-2}$ --
Column 9, Line 26: delete "a" and insert -- $\sigma$ --
Column 9, Line 67: delete "$\lambda$," and insert -- $\lambda$ --
Column 10, Line 6: delete "$\Delta_{MIN}$" and insert -- $\lambda_{MIN}$ --
Column 10, Line 10: delete "$\lambda\Delta_1$" and insert -- $\Delta\lambda_1$ --
Column 10, Line 56: after "10%" insert -- . --
Column 11, Line 17: delete "apotization" and insert -- apodization --
Column 12, Line 10: delete "an/or" and insert -- and/or --
Column 12, Line 19: delete "inhomogeneties." and insert -- inhomogeneities. --
Column 15, Line 2: in Claim 23, delete "$\lambda\lambda \geq 0.15$" and insert -- $\Delta\lambda \geq 0.15$ --

Signed and Sealed this
Fourth Day of December, 2012

David J. Kappos
*Director of the United States Patent and Trademark Office*